US006617920B2

(12) United States Patent
Staudinger et al.

(10) Patent No.: US 6,617,920 B2
(45) Date of Patent: Sep. 9, 2003

(54) LINEAR ENVELOPE TRACKING RF POWER AMPLIFIER WITH ADAPTIVE ANALOG SIGNAL PROCESSING

(75) Inventors: Joseph Staudinger, Gilbert, AZ (US); David A. Newman, Tempe, AZ (US); Benjamin R. Gilsdorf, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/123,271

(22) Filed: Apr. 16, 2002

(65) Prior Publication Data

US 2002/0145470 A1 Oct. 10, 2002

Related U.S. Application Data

(62) Division of application No. 09/595,073, filed on Jun. 16, 2000, now Pat. No. 6,407,634.

(51) Int. Cl.[7] .................................................. H03F 3/38
(52) U.S. Cl. ......................... 330/149; 330/10; 375/297; 455/63; 455/126
(58) Field of Search .................. 330/149, 10; 375/297; 455/63, 126

(56) References Cited

U.S. PATENT DOCUMENTS 5,886,572 A     3/1999    Myers et al.
6,407,634 B1 *  6/2002    Staudinger et al. ......... 330/149

FOREIGN PATENT DOCUMENTS

JP    10224159     *  8/1998
JP    2000174559   *  6/2000

OTHER PUBLICATIONS

Anderson et al. "High–Efficiency High–Level Modulator for use in Dynamic Envelope Traking CDMA RF Power Amplifiers" Microwave Symposium Digest, vol. 3, 2001 pp 1509–1512.*

* cited by examiner

Primary Examiner—Michael B Shingleton

(57) ABSTRACT

A linear envelope tracking radio frequency (RF) power amplifier having an adaptive analog signal processing circuit. The amplifier outputs a voltage which is sampled by the adaptive analog signal processing circuit. The adaptive analog signal processing circuit generates an error signal which varies the linearity of the power amplifier. In one embodiment, the error signal controls a modulator which in turn controls the supply voltage to the power amplifier. In another embodiment, the control signal varies a controller which in turn varies a load placed on the power amplifier. The load in turn varies in linearity of the amplifier.

10 Claims, 2 Drawing Sheets

LINEAR ENVELOPE TRACKING RF POWER AMPLIFIER WITH ADAPTIVE ANALOG SIGNAL PROCESSING

This is a divisional of application Ser. No. 09/595,073, filed Jun. 16, 2000, now U.S. Pat. No. 6,407,634.

BACKGROUND OF THE INVENTION

1. Field of the Invention

The present invention generally relates to radio frequency power amplifiers and, more particularly, to applying adaptive signal processing to control the power amplifier to improve the overall amplifier linearity and efficiency.

2. Background Information

Present second generation cellular systems, personal communications, and planned third generation wireless systems employ digital modulation techniques such as quadrature phase-shift keying (QPSK). Some QPSK systems require that the power amplifier contained in the transmitter of the portable radio handset meet strict linearity requirements which stem from the modulation format and the selected baseband filtering. The amplifier must be linear to accurately reproduce both the time varying amplitude and phase characteristics of the signal in order to minimize interference in adjacent or alternate channels and preserve the quality of the transmitted signal.

In addition to linearity, a primary consideration for power amplifiers, particularly battery powered mobile radios where extending battery life is crucial, is efficiency. Efficiency is defined as the ratio of radio frequency (RF) power output by the amplifier and supplied to the load divided by direct current (DC) power supplied to the amplifier from a power source. In general, linear power amplifiers are less efficient than non-linear power amplifiers. The lower efficiency is due in large part to the degree to which the active device operates in gain compression. By their nature, linear amplifiers only reproduce the desired amplitude and phase characteristics of the modulated input signal if operated below, or at worst, slightly in gain compression. Such operation results in an inherent trade-off between efficiency, which is maximum under gain compression, and linearity, where no gain compression occurs.

A further characteristic of second generation cellular systems which affects power amplifier efficiency and battery life of the mobile radio is the use of transmitter power control. Power control occurs when the base station commands the mobile radio to output power levels ranging from a maximum level to relatively low levels, such as 10's of decibels (Db) from maximum. The time period over which the mobile radio functions at reduced transmit power levels is statistical in nature and dependent on numerous factors. For example, studies on selected systems have shown utilization of aggressive power control, thus placing the mobile radio transmitter in back-off mode for extended time intervals. Consequently, the radio frequency amplifier operates for extended time periods in deep back-off or very low power where efficiency may be very low. Other systems tend to operate over extended periods of time close to maximum output power. Overall efficiency depends on the amount of time that the amplifier operates at a particular power level and the corresponding efficiency at that power level.

Maintaining high power amplifier efficiency while maintaining signal linearity under back-off conditions can be addressed utilizing an envelope tracking type of amplifier. In an envelope tracking system, the drain supply voltage to the radio frequency power amplifier varies with respect to the average power contained in the input RF signal. Operationally, a Class-S modulator efficiently transfers the battery voltage to a different one supplied to the amplifier voltage. Alternatively, a linear regulator can be used in place of the Class-S modulator at the expense of lower overall efficiency. The RF power amplifier efficiency improves under back-off conditions because the DC power delivered to the amplifier is reduced from situations where the drain supply voltage equals the battery voltage. In addition, the amplifier remains linear as long as the drain supply voltage enables the amplifier to operate below gain compression and therefore does not significantly distort the amplitude of the modulated envelope.

A significant consideration in designing such an amplifier for high volume mobile radio handsets relates to establishing and implementing a control mechanism which yields the desired functional relationship between input power and the drain supply voltage. Present systems employ an open loop control where a control voltage determines the drain supply voltage developed by the Class-S modulator. This requires predetermined knowledge of the average power of the input signal and the desired functional relationship between the control voltage and the input power. A digital signal processor (DSP) typically determines the control voltage. However, the required functional relationship between the control voltage and the input power depends on the transfer characteristics of each individual component. The gain transfer characteristics of the RF power amplifier and Class-S modulator must be determined a priori. Such characteristics are set during manufacture and inherently include a significant margin, lowering the overall efficiency. Further, because the control system is open loop, the control system must compensate for component, parametric, temperature, and other variations and requires compensation through additional testing and characterization during radio phasing. Hence, component variations and the resulting cost, time, and complexity associated with compensating for variation is significant.

Many cellular systems have adopted time division multiple access (TDMA) architectures. In TDMA systems, the radio transmits and receives information only during certain specified time intervals. TDMA systems divide time into periods, defined as frames. The frames are further divided into intervals defined as slots. Frames repeat as time progresses. For example, a given mobile phone user, user A is typically assigned a slot by the base unit within the frame. User A may transmit voice and data information in that frame. User A transmits during the predetermined slot, and does not transmit during any other slot. User A continues to transmit in the predetermined slot of subsequent frames until directed otherwise. In systems utilizing TDMA architecture, it is desirable to maximize the trade-off between efficiency and linearity of the RF power amplifier. Because the amplifier transmits information only during specified time intervals, amplifier efficiency should be maximized during those time periods, with the signal exhibiting an acceptable level of linearity.

Mobile radios do not presently enable measuring the distortion level of the transmitted signal, and based on that level, adjusting the RF power amplifier to improve efficiency or linearity. This can be particularly advantageous in optimizing the trade-off between efficiency and linearity while the radio is in operation. Consider the following scenarios: 1) If the transmitted signal is slightly distorted, but falls within an allowable distortion level, present systems do not enable an adjustment to the RF amplifier to improve efficiency. An adjustment would increase distortion of the transmitted signal, but with less margin, while remaining within a required range. 2) If the transmitted signal is highly distorted beyond an acceptable level, present systems do not enable an adjustment to reduce signal distortion. Hence, the amplifier operates at an unacceptable distortion level.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EMBODIMENTS

The ensuing detailed description provides preferred embodiments only, and is not intended to limit the scope, applicability, or configuration of the invention. Rather, the ensuing detailed description of the exemplary embodiments will provide those skilled in the art with an enabling description for implementing a preferred embodiment of the invention. It being understood that various changes may be made in the function and arrangement of elements without departing from the spirit and scope of the invention as set forth in the appended claims.

The present invention is directed to an apparatus and method for implementing an envelope tracking power amplifier system that includes an adaptive analog signal processing circuit that sets the radio frequency (RF) power amplifier supply voltage. In one embodiment the supply voltage produced by a modulator and applied to the RF power amplifier is adaptively set and determined by an analog signal processing circuit. The analog signal processing circuit first samples the modulated envelope voltage at the output of the RF power amplifier, processes it, then uses the processed signal to control the modulator output voltage. Adaptively varying the supply voltage applied to the RF power amplifier results in both high efficiency and high linear power amplification. A second embodiment of the present invention is directed to varying a load applied to the output of an RF power amplifier. A circuit for controlling the load on the power amplifier provides a selection of discrete load states which may be applied to the power amplifier. By varying the load on the power amplifier, the efficiency and the linear amplification of the power amplifier may be varied. In the second embodiment, an error signal is averaged over a predetermined time interval then processed by a comparator. The comparator outputs a control word for input to a controller which varies the load states applied to the output of the RF power amplifier.

Figure 1:
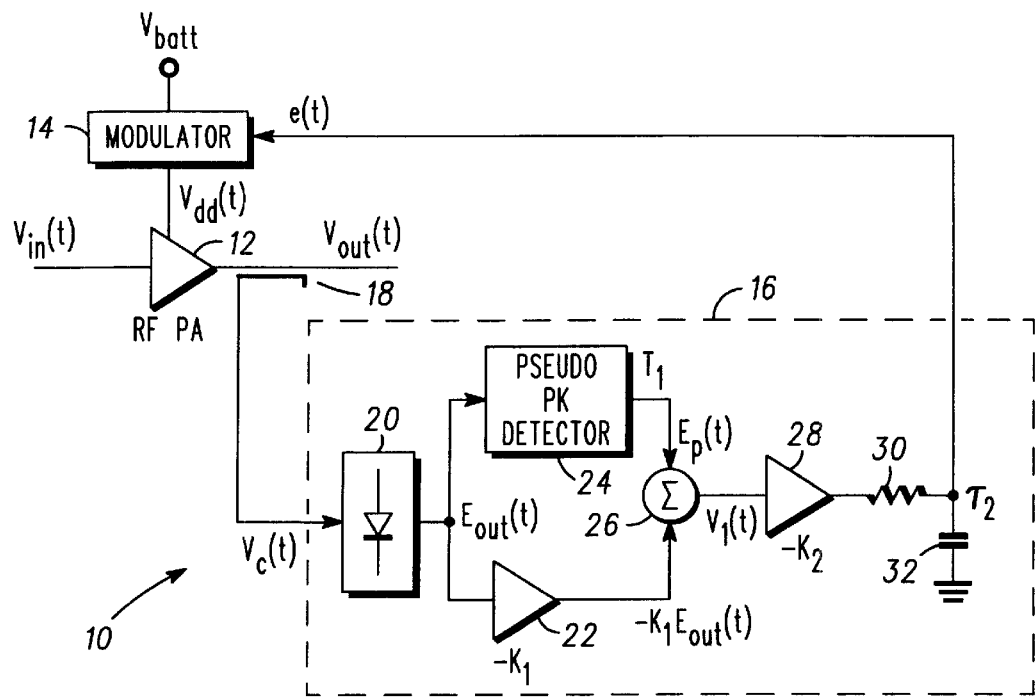
FIG. 1 is a block diagram of a first embodiment of the linear envelope tracking system arranged in accordance with the principles of the present invention.

With respect to FIG. 1, a linear envelope tracking system 10 arranged in accordance with a first embodiment of the present invention is depicted. Linear envelope tracking system 10 is particularly applicable to cellular systems which implement code division multiple access (CDMA) architectures utilizing a quadrature phase-shift keying (QPSK) modulation technique. Linear envelope tracking system 10 includes a radio frequency (RF) power amplifier (PA) 12. RF power amplifier 12 receives an input signal $V_{in}(t)$ for amplification and outputs an output signal $V_{out}(t)$. The linearity and amplification provided by RF power amplifier 12 is determined in accordance with a bias voltage $V_{dd}(t)$. A modulator 14 receives an input signal $V_{batt}$ and modulates the input signal to the bias voltage $V_{dd}(t)$ to thereby vary the amplification properties of RF power amplifier 12. Modulator 14 may be of any of a known number of modulators which receive an input voltage and modulate the input voltage down to predetermined output voltage. For example, such a modulator may be a Class-S modulator as is known. An error signal e(t) is input to modulator 14 in order to vary modulation of the input voltage $V_{batt}$ to the output voltage of $V_{dd}(t)$. The error signal is generated by a processing circuit 16, which is embodied as an analog processing circuit in FIG. 1.

Processing circuit 16 receives a portion of the output signal $V_{out}(t)$ through a coupler 18 and generates the error signal e(t) which varies in accordance with the difference between a desired $V_{out}(t)$ and an actual $V_{out}(t)$. In operation, the sampled signal is applied to an envelope detector 20. Envelope detector 20 determines the voltage envelope of the output signal $V_{out}(t)$ by processing input signal $V_c(t)$ and generates a modulated envelope signal $E_{out}(t)$. The envelope signal $E_{out}(t)$ is applied to inverter 22 and pseudo-peak detector 24. Inverter 22 inverts the signal $E_{out}(t)$ and applies a gain constant K to output the signal $-K_1 \cdot E_{out}(t)$. Pseudo-peak detector 24 determines a peak tracking voltage $E_p(t)$ which generally tracks the peaks of the envelope signal $E_{out}(t)$. Pseudo-peak detector 24 is generally defined as a relatively short term detector in that it produces $E_p(t)$ which is proportional to the maximum value of $E_{out}(t)$. Pseudo-peak detector 24 includes a decay time constant $\theta_1$ which is inversely proportional to the modulation bit rate so that EP(t) is approximately proportional to the maximum of $E_{out}(t)$ over a time period of, for example, a predefined symbol length. The two signals $E_p(t)$ and $-K_1 \cdot E_{out}(t)$ are combined at summer 26 to output a voltage $V_1(t)$, which may be defined below as equation (1):

$$V_1(t) = E_p(t) - K_1 \times E_{out}(t) \tag{1}$$

The signal $V_1(t)$ is then applied to inverter 28 which inverts the signal $V_1(t)$ and applies a constant gain $K_2$. The output from inverter 28 is applied to a low pass filter formed by resistor 30 and capacitor 32, which has a time constant $\theta_2$ to form an error signal e(t) which is input to modulator 14. Error signal e(t) thus represents a low pass filtered signal which comprises a signal proportional to the peak of the envelope and a signal proportional to an inverted amplified version of the modulated envelope. Because the modulated envelope has a time varying amplitude, e(t) is an analog error signal that varies about the statistical peak-to-average power ratio of the modulated signal.

Figure 2:
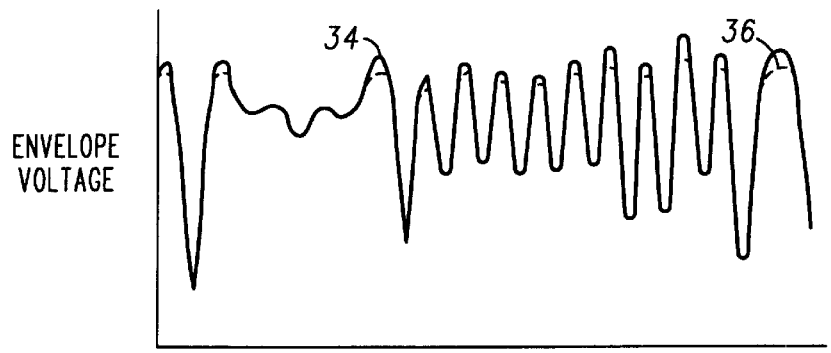
FIG. 2 is a graph of an envelope voltage versus time for a linear envelope tracking system.

To better describe the operation of processing circuit 16, FIG. 2 depicts an example envelope voltage for RF power amplifier 12. Processing circuit 16 generally assumes that amplifier linearity is to a first order directly proportional to the limiting action exhibited on high peak excursions of the modulated RF signal envelope caused by gain compression in RF power amplifier 12. Waveform 34 corresponds to the absolute value of an undistorted $E_{out}(t)$. Waveform 36 corresponds to the absolute value of a distorted $E_{out}(t)$ with the peaks compressed. The difference between waveforms 34 and 36 defines a signal distortion of the output signal. One measure of signal distortion is the ratio of the peak to time average value of the output envelope voltage as described below in equation (2):

$$\frac{E_{out}(t)_{ave}}{E_{out}(t)_{peak}} = H_D \qquad (2)$$

where $H_D$ is proportional to the signal distortion. The above equation can be rewritten to define the error signal $E_t$ as shown in equation (3):

$$e(t)E_{out}(t)_{ave} \times H_D - E_{out}(t)_{avg} \qquad (3)$$

Based on the above mathematical determination, error signal e(t) represents a measure of signal distortion. Thus, e(t) forms the basis from which modulator 14 modulates battery voltage $V_{batt}$ down to power amplifier supply voltage $V_{dd}(t)$.

Figure 3:
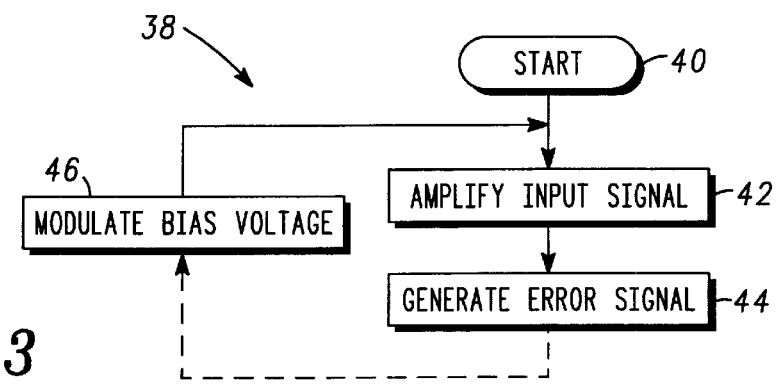
FIG. 3 is a flow chart for describing a method of operation of the linear envelope tracking system of FIG. 1.

FIG. 3 depicts a flow chart 38 for describing the method of linear envelope tracking for RF power amplifier, particularly as implemented in FIG. 1. Control starts at start block 40 and precedes to process block 42. Process block 42 amplifies the input signal $V_{in}(t)$ to produce output signal $V_{out}(t)$. Control next proceeds to process block 44 which generates the error signal as described above with respect to processing circuit 16. The error signal is input to process block 46. Process block 46 modulates a supply voltage to bias voltage for input and use by process block 42 which amplifies the input signal.

Figure 4:
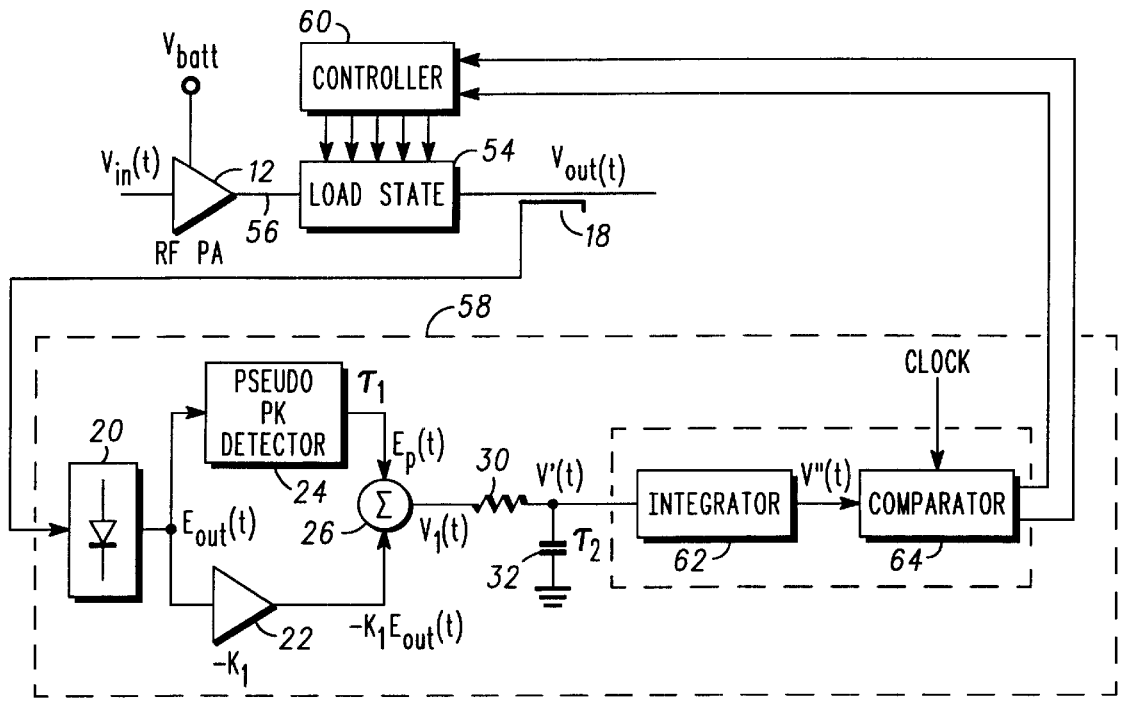
FIG. 4 is a block diagram of a second embodiment of the linear envelope tracking system arranged in accordance with the principles of the present invention.

FIG. 4 depicts a block diagram of a linear envelope tracking system arranged in accordance with the principles of a second embodiment of the present invention. It should be noted that like reference numerals will be referred to like elements of FIG. 1. Accordingly, an input signal $V_{in}(t)$ is input to RF amplifier 12. RF power amplifier 12 operates similarly as described with respect to FIG. 1, except the bias voltage is fixed at the battery voltage $V_{batt}$. RF power amplifier 12 outputs an amplified signal to load state circuit 54. Load state circuit 54 provides a matrix of discrete load states that may be applied to the output of RF power amplifier 12. Thus, load line 56 at the output of RF power amplifier 12 may assume any of a number of predetermined states in accordance with the matrix of discrete load states stored within load state circuit 54. By switching between a number of discrete load states, the output from RF power amplifier 12 may be operated at various efficiencies and linearities. Load state circuit 54 outputs the output signal $V_{out}(t)$.

A portion of the output signal $V_{out}(t)$ is sampled by coupler 18 and input to a processing circuit 58. In general, processing circuit 58 generates a control word for input to load state controller 60. Load state controller 60 outputs a selection signal for input to load state circuit 54 to select between one of a number of available load states for application to the output of RF power amplifier 12.

A signal sampled at coupler 18 is input to envelope detector 20, which operates as described above with respect to FIG. 1. Envelope detector 20 outputs an envelope signal $E_{out}(t)$ which is input to inverter 22 and pseudo-peak detector 24, both of which operate as described with respect to FIG. 1. The output from inverter 22 and pseudo-peak detector 24 is input to summer 26. Summer 26 outputs a voltage signal $V_1(t)$ which is input to a low pass filter formed by resistor 30 and capacitor 32, as describe above with respect to FIG. 1. The low pass filter outputs a signal $V'(t)$ which may be generally described as shown below with respect to equation (4):

$$V'(t) = V_1(t) \hat{x} h(t) \qquad (4)$$

where θ denotes convolution and h(t) represents the impulse response of the low pass filter formed by resistor 30 and capacitor 32.

V'(t) is input to integrator 62 which generates a time-averaged value of the signal V'(t). Integrator 62 may average V'(t) over a predetermined time period. Integrator 62 outputs a signal V''(t) which represent a time-averaged value of V'(t). Thus, integrator 62 outputs a signal V''(t) which is proportional of the average value of V'(t). That is, V''(t) is equivalent or analogous to error signal e(t). The integrated signal V''(t) is compared to a reference by comparator 64, such as a window comparator. Comparator 64 outputs a word, such as a two bit word, which indicates the level of distortion in the signal output by power amplifier 12 relative to a desired distortion level HD.

Figure 5:
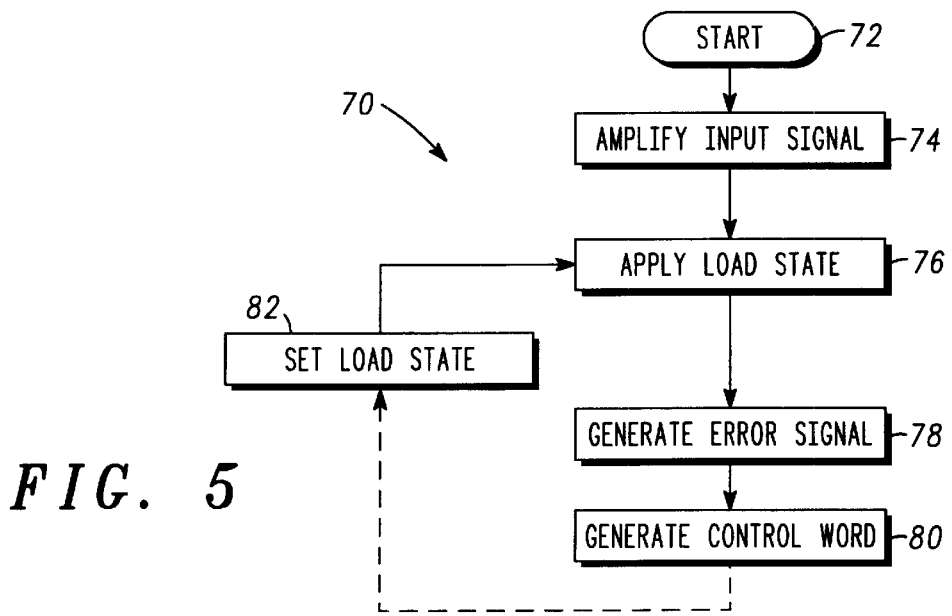
FIG. 5 is a flow chart for describing operation of the linear envelope tracking system of FIG. 4.

FIG. 5 depicts a flow chart 70 for describing operation of FIG. 4. Control begins at start block 72 and proceeds to process block 74. Process block 74 amplifies the input signal $V_{in}(t)$ and outputs a signal. Process blocks 76 applies a load to the output of the amplifier, thereby generating the output signal $V_{out}(t)$. Control next proceeds to process block 78 where an error signal is generated and output to process block 80. Process block 80 generates a control word in accordance with the error signal. The control word is input to process block 82. Process block 82 determines the desired load state and outputs the desired load state to provide load state 76.

While the principles of the invention have been described above in connection with specific apparatus, it is to be clearly understood that this description is made only by way of example and not as a limitation on the scope of the invention.

What is claimed is:

1. An apparatus for adjusting the output of a linear envelope tracking radio frequency (RF) system, comprising:
    a power amplifier, the power amplifier receiving an input signal and generating an RF output signal;
    a load device connected to the output of the power amplifier, the load device placing a load on the output of the power amplifier in accordance with a distortion of the output signal;
    a controller, the controller generating a control signal to the load device to select the load placed on the output of the power amplifier; and
    an distortion detection circuit, the distortion detection circuit generating a distortion signal for input to the controller, the distortion signal being determined in accordance with a gain compression of the RF output signal, wherein the controller varies the control signal in accordance with the distortion signal.

2. The apparatus of claim 1 wherein the distortion detection circuit further comprises:
    an envelope detector, the envelope detector receiving the output signal and determining a voltage envelope for the output signal, the envelope detector generating a modulated envelope signal;
    a peak detector circuit, the peak detector circuit receiving the modulated envelope signal and generating a peak signal, the peak signal being proportional to the envelope signal over a predetermined time interval;
    a first gain circuit, the first gain circuit receiving the modulated envelope signal, the first gain circuit generating a proportional signal, the proportional signal being the product of the modulated envelope signal and a first predetermined value; and
    a summer, the summer generating a summation signal, the summation signal being the sum of the peak signal and the proportional signal.

3. The apparatus of claim 2 further comprising a filter, the filter receiving the gain signal and averaging the gain signal over time to define the error signal, wherein the error signal defines a difference between a desired output signal and an actual output signal.

4. The apparatus of claim 3 further comprising an integrator, the integrator averaging the error signal over a predetermined time interval and generating an average signal.

5. The apparatus of claim 4 further comprising a comparator, the comparator comparing the average signal to reference signal, wherein the difference between the average signal and the predetermined reference defines the distortion signal.

6. A method for adjusting the output of a linear envelope tracking radio frequency (RF) system, comprising the steps of:

amplifying an input signal to generate an RF output signal;

placing a load on the output of the power amplifier, the load being variable to vary the linearity of the power amplifier;

selecting the load placed on the output of the power amplifier; and generating a distortion signal for varying the step of selecting the load, the error signal being determined in accordance with a distortion of the RF output signal, wherein the distortion signal varies the load placed on the output of the amplifier.

7. The method of claim 6 wherein the step of generating a distortion signal further comprises the steps of:

determining a voltage envelope for the output signal and generating a modulated envelope signal;

generating a peak signal, the peak signal being proportional to the envelope signal over a predetermined time interval;

generating a proportional signal, the proportional signal being the product of the modulated envelope signal and a first predetermined value; and generating a summation signal, the summation signal being the sum of the peak signal and the proportional signal.

8. The method of claim 6 further comprising the step of filtering the summation signal, wherein the filtered signal defines an error signal, wherein the error signal defines a difference between a desired output signal and an actual output signal.

9. The method of claim 8 further comprising averaging the error signal over a predetermined time interval and generating an average signal.

10. The method of claim 9 further comprising comparing the average signal to a predetermined reference signal, wherein the difference between the average signal and the predetermined reference defines the distortion signal.

* * * * *